United States Patent [19]

Itobayashi et al.

[11] 4,443,770
[45] Apr. 17, 1984

[54] AUTOMATIC LEVEL CONTROL CIRCUIT

[75] Inventors: Manabu Itobayashi; Hisao Ohtawa, both of Itami, Japan

[73] Assignee: Mitsubishi Denki Kabushiki Kaisha, Tokyo, Japan

[21] Appl. No.: 276,873

[22] Filed: Jun. 24, 1981

[30] Foreign Application Priority Data

Jun. 27, 1980 [JP] Japan .................................. 55-88319

[51] Int. Cl.³ ............................................. H03G 3/30
[52] U.S. Cl. ..................................... 330/284; 330/295
[58] Field of Search ............... 330/279, 284, 288, 295, 330/307

[56] References Cited

FOREIGN PATENT DOCUMENTS 54-21241 2/1979 Japan ................................... 330/279

Primary Examiner—James B. Mullins
Attorney, Agent, or Firm—Oblon, Fisher, Spivak, McClelland & Maier

[57] ABSTRACT

An automatic level control circuit comprises a first transistor which receives a direct current output obtained by converting respectively output voltages of a pair of amplifiers by each rectifying circuit, through a first resistor to a base thereof; a second resistor connected between an emitter of said first transistor and the ground; a second transistor whose collector is connected to a collector of said first transistor and whose emitter is connected through a third resistor to a power source; a third transistor whose emitter and base are respectively connected to the base and collector of said transistor; and whose collector is gounded; fourth and fifth transistors having a multicollector structures having each base connected to the base of said third transistor and having collector of one connected to a collector of the other transistor each other; fourth and fifth resistors connected between emitters of said fourth and fifth transistors and said power source; sixth and seventh transistors whose bases are respectively connected to each of collectors of said fourth and fifth transistors; sixth and seventh resistors which are respectively connected between said power source and each of collectors of sixth and seventh transistors; eighth and ninth resistors which are respectively connected between each base and emitter of said sixth and seventh transistors; eighth and ninth transistors whose bases are respectively connected to each of emitters of said sixth and seventh transistors; and whose emitters are grounded; and each of input resistors connected to each of collectors of said eighth and ninth transistors to attain automatic leveling operation by utilizing saturated resistances of said eighth and ninth transistors.

4 Claims, 4 Drawing Figures

AUTOMATIC LEVEL CONTROL CIRCUIT

BACKGROUND OF THE INVENTION

1. Field of the Invention

The present invention relates to an automatic level control circuit for controlling input levels of a stereo-tape recorder etc. (hereinafter referring to as ALC circuit). More particularly, it relates to ALC circuit having a small output voltage unbalance between channels.

2. Description of the Prior Arts

FIG. 1 shows a conventional ALC circuit wherein as suffixes of symbols, a means the side of channel 1; b means the side of channel 2 and no suffix means a common circuit for both channels. In FIG. 1, the reference (1) designates a smoothing capacitor; (2) designates a resistor connected in parallel to the smoothing capacitor; (3) designates a base control resistor of an NPN transistor (4); (5) designates an emitter resistor of the transistor (4); (6) designates a vertical PNP transistor; (7), (8a) and (8b) respectively lateral PNP transistors; (9), (10a) and (10b) respectively designate emitter resistors of the transistors (7), (8a) and (8b), which are connected to the transistors (6), (7), (8a), (8b) to form a current mirror circuit. The reference (11a) and (11b) respectively designate each collector current control resistor of the NPN transistors (12a) and (12b); the references (13a) and (13b) respectively designate ALC transistors driven by the transistors (12a) and (12b); the references (14a) and (14b) respectively designate input resistors; (15a) and (15b) respectively designate input coupling condensers; (16a) and (16b) respectively amplifiers; (17a) and (17b) respectively designate input terminals of the amplifiers (16a) and (16b); and (18a) and (18b) respectively designate output terminals.

The conventional ALC circuit has the above-mentioned structure. When an input signal vi is applied to the external input terminal (20a) and an external input terminal (20b), each output viG is given at each of the output terminals (18a), (18b). The outputs are converted into DC outputs by rectifying circuits (21a), (21b) and the DC outputs are applied through the resistor (3) to the base of the transistor (4), whereby the transistor (4) is in ON state. The current is fed through the collector of the transistor (7) into the transistor (4). The transistors (12a), (12b) are driven by feeding respectively equal current through the collectors of the transistors (8a), (8b) to the bases of the transistors (12a), (12b) by a current mirror circuit made of the transistors (6), (7), (8a), (8b) and the resistors (9), (10a), (10b). Each base current is fed to the ALC transistors (13a), (13b) by the transistors (12a), (12b) whereby the ALC transistors (13a), (13b) are saturated to attain the ALC operation. The input levels at the input terminals (17a), (17b) of the amplifiers (16a), (16b) are attenuated to vi·Rs/(Ri+Rs) and the outputs of the amplifiers (16a), (16b) are respectively given as $$vi \cdot G \cdot Rs/(Ri+Rs)$$

wherein Rs designates a saturated resistance of the ALC transistors (13a), (13b).

When the external input vi increases, the outputs of the amplifiers (16a), (16b) increase and a DC potential applied to the base of the transistor (4) increases whereby the collector current of the transistor (7) of the current mirror circuit and the emitter currents of the transistors (7), (8a), (8b) increase. When the emitter currents of the transistors (8a), (8b) increase, the emitter currents of the transistors (12a), (12b) increase and the base currents fed to the ALC transistors (13a), (13b) increase whereby the saturated resistances Rs of the ALC transistors (13a), (13b) decrease. That is, the ratio for attenuation Rs/(Ri+Rs) decreases to counterbalance the signal vi·Rs/(Ri+Rs) applied to the input terminals (17a), (17b) of the amplifiers to be a constant and the output of the amplifiers vi·G·Rs/(Ri+Rs) becomes a constant.

On the contrary, when the external input vi decreases, the output of the amplifiers becomes a constant under the same consideration.

Thus, the conventional circuits often cause unbalances between the output voltage of the channel 1 and the output voltage of the channel 2 in view of the difference of characteristics of $V_{BE}$ of the transistors (8a), (8b) or the difference of $h_{FE}$ of the transistors (12a), (12b). FIG. 2 shows an operation diagram for illustrating disadvantages of the conventional ALC circuit by numerical equations. For example, the currents $I_{Ba}$, $I_{Bb}$ fed into the bases of the ALC transistors (13a), (13b) are given by the equations:

$$I_{Ba} = I_{1a}(1 + h_{FEa}) \tag{1}$$

$$I_{Bb} = I_{1b}(1 + h_{FEb}) \tag{2}$$

wherein the references $I_{1a}$, $I_{1b}$ respectively designate emitter currents of the transistors (8a), (8b) and $h_{FEa}$ and $h_{FEb}$ respectively designate $h_{FE}$ of the transistors (12a), (12b).

The values $I_{1b}$ and $h_{FEb}$ are given by the equations:

$$I_{1b} = I_{1a} + \Delta I \tag{3}$$

$$h_{FEb} = h_{FEa} + \Delta h_{FE} \tag{4}$$

wherein $I_{1b} < I_{1a}$ and $h_{FEb} < h_{FEa}$.

The ratio of $I_{Bb}$ to $I_{Ba}$ is given by the equation:

$$\frac{I_{Bb}}{I_{Ba}} = \frac{I_{1b}(1 + h_{FEb})}{I_{1a}(1 + h_{FEa})} \approx \frac{I_{1b} \, h_{FEb}}{I_{1a} \, h_{FEa}} \tag{5}$$

$$= \frac{1}{I_{1a} h_{FEa}} (I_{1a} + \Delta I)(h_{FEa} + \Delta h_{FE})$$

$$= \left(1 + \frac{\Delta I}{I_{1a}}\right)\left(1 + \frac{\Delta h_{FE}}{h_{FEb}}\right)$$

The saturated resistances Rsa, Rsb of the transistors (13a), (13b) respectively given by the equations:

$$Rsa = ka/I_{Ba} \tag{6}$$

$$Rsb = kb/I_{Bb} \tag{7}$$

wherein the references ka, kb respectively designate constants given by a size and a shape and $V_{CE}$ of each transistor.

The ratio of Vob to Voa as the outputs of the amplifiers (16a), (16b) is given as follows by the equations (5), (6) and (7).

$$\frac{Vob}{Voa} = (Rsb \cdot vi \cdot G/(Ri + Rsb)/(Rsa \cdot vi \cdot G/(Ri + Rsa)) \approx \tag{8}$$

-continued $$\frac{Rsb}{Rsa} = \frac{kb}{ka} \cdot \frac{I_{Ba}}{I_{Bb}} = \frac{kb}{Ka}.$$

$$\frac{1}{\left(1 + \frac{\Delta I}{I_{1a}}\right)\left(1 + \frac{\Delta h_{FE}}{h_{FE}}\right)} \approx \frac{kb}{ka} \cdot \left(1 - \frac{\Delta I}{I_{1a}}\right) \cdot$$

$$\left(1 - \frac{\Delta h_{FE}}{h_{FEa}}\right) \quad 10$$

As a practical example, in the case of $I_{1a}=40$ µA, $I_{1b}=44$ µA, $h_{FEa}=100$ and $h_{FEb}=110$, it provides $\Delta I=4$ µA and $\Delta h_{FE}=10$ and $$Vob/Voa = 0.9 \times 0.9 = 0.81 \quad (9)$$

in view of the equation (8).

The output of Vob is only 81% to Voa.

As it is found by the equation (8), in the conventional circuit, the output voltage is affected by both of the difference of emitter currents caused by the difference of $V_{BE}$ of the transistors (8a), (8b) and the difference of $h_{FE}$ of the transistors (12a), (12b) whereby the unbalance of output voltages between channels disadvantageously increases.

SUMMARY OF THE INVENTION

It is an object of the present invention to overcome the disadvantage and to provide an ALC circuit which minimizes unbalance of output voltages of amplifiers between channels even though characteristics of $V_{BE}$ or $h_{FE}$ of transistors are slightly different.

The foregoing and other ojects of the present invention have been attained by providing an automatic level control circuit which comprises a first transistor which receives a direct current output obtained by converting respectively output voltages of a pair of amplifiers by each rectifying circuit, through a first resistor to a base thereof; a second resistor connected between an emitter of said first transistor and the ground; a second transistor whose collector is connected to a collector of said first transistor and whose emitter is connected through a third resistor to a power source; a third transistor whose emitter and base are respectively connected to the base and collector of said transistor and whose collector is grounded; fourth and fifth transistors having a multicollector structures having each base connected to the base of said second transistor and having a collector of one connected to a collector of the other transistor each other; fourth and fifth resistors connected between emitters of said fourth and fifth transistors and said power source; sixth and seventh transistors whose bases are respectively connected to each of collectors of said fourth and fifth transistors; sixth and seventh resistors which are respectively connected between said power source and each of collectors of sixth and seventh transistors; eighth and ninth resistors which are respectively connected between each base and emitter of said sixth and seventh transistors; eighth and ninth transistors whose bases are respectively connected to each of emitters of said sixth and seventh transistors; and whose emitters are grounded; and each of input resistors connected to each of collectors of said eighth and ninth transistors to attain automatic leveling operation by utilizing saturated resistances of said eighth and ninth transistors.

DETAILED DESCRIPTION OF THE PREFERRED EMBODIMENTS

Figure 1:
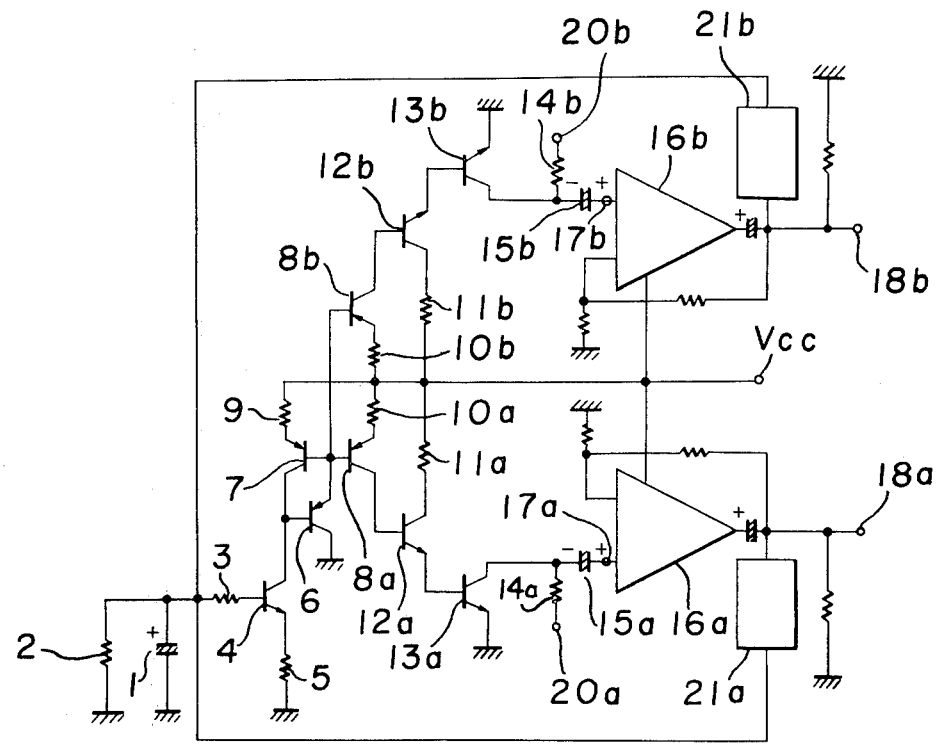
FIG. 1 shows a circuit diagram of the typical conventional ALC circuit.
Figure 2:
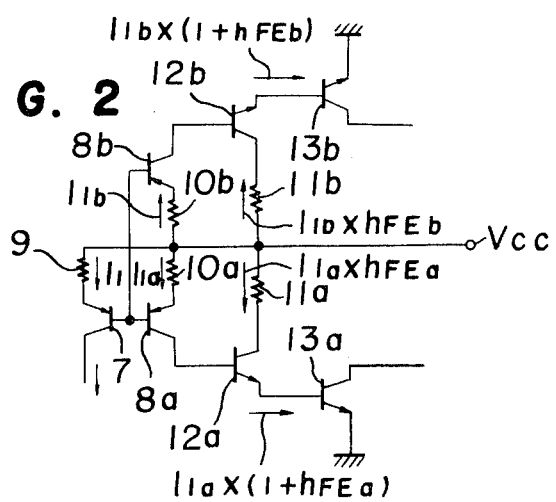
FIG. 2 shows an operation diagram of FIG. 1.
Figure 3:
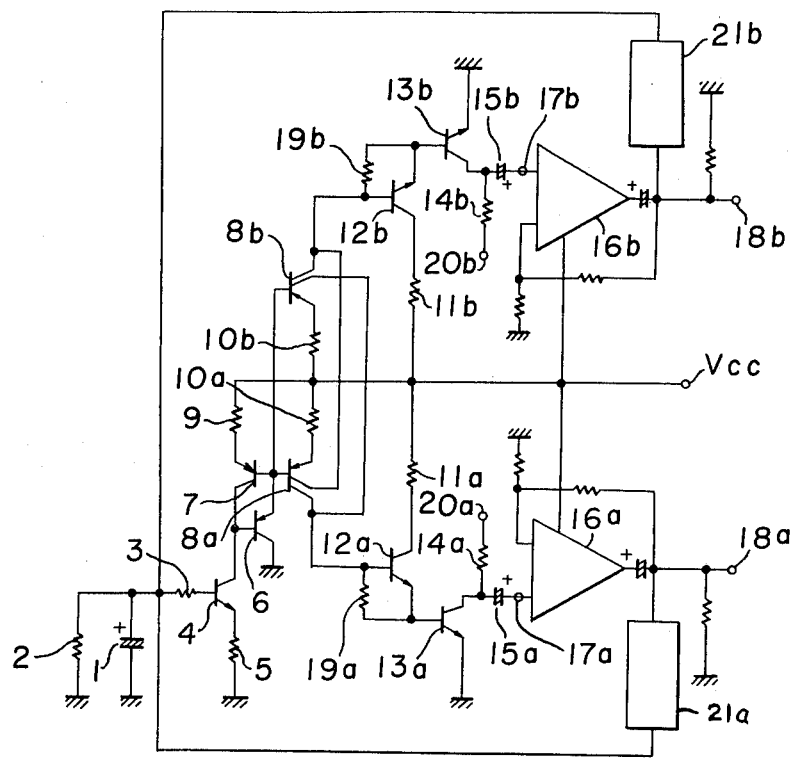
FIG. 3 shows a circuit diagram of one embodiment of the present invention.

FIG. 3 shows one embodiment of ALC circuit of the present invention; wherein the same references respectively designate the identical or corresponding parts of FIG. 1. The parts different from the parts of FIG. 1 are as follows. Each of PNP transistors (8a), (8b) is formed by each multicollector PNP transistor having two collectors. Each of the collectors is respectively connected to each base of the next transistors (12a), (12b) and also respectively connected to each other collector of the transistors (8a), (8b) in the other channel side. Each of resistors (19a), (19b) is connected between each base and each emitter of the transistors (12a), (12b).

Figure 4:
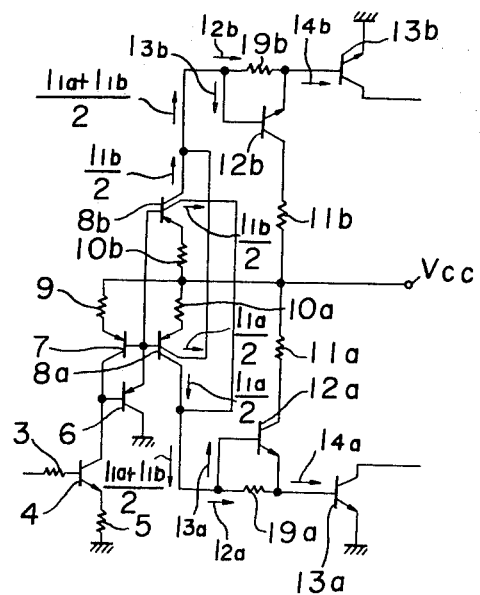
FIG. 4 shows an operation diagram of FIG. 3.

When the emitter currents of the transistors (8a), (8b) are shown as $I_{1a}$, $I_{1b}$ and the currents fed to the resistors (19a), (19b) are shown as $I_{2a}$, $I_{2b}$ in the ALC circuit having the above-mentioned structure as shown in FIG. 4, the currents $I_{3a}$, $I_{3b}$ fed to the bases of the transistors (12a), (12b) are given by the equations:

$$I_{3a} = \frac{I_{1a} + I_{1b}}{2} - I_{2a}$$

$$I_{3b} = \frac{I_{1a} + I_{1b}}{2} - I_{2b}$$

If the resistances of the resistor (19a) and the resistor (19b) are equal, it provides $I_{2a}=I_{2b}$. Even though $I_{1a}$ is different from $I_{1b}$ depending upon the difference of $V_{BE}$ of the transistors (8a), (8b), it always provides $I_{3a}=I_{3b}$. The transistors (12a), (12b) are actuated by always feeding equal base currents.

When the values $h_{FE}$ of the transistors (12a), (12b) are respectively given as $h_{FEa}$, $h_{FEb}$; and the resistances of the resistors (19a), (19b) are respectively given as $R_{1a}$, $R_{1b}$, the values $I_{2a}$, $I_{2b}$ are given by the equations:

$$I_{2a} = V_{BE}/R_{1a} \quad (10)$$

$$I_{2b} = V_{BE}/R_{1b} \quad (11)$$

The currents $I_{4a}$, $I_{4b}$ fed to the bases of the transistors (13a), (13b) are given by the following equations in the following two cases.

(a) The transistors (12a), (12b) are not in ON state:

$$\left(\text{i.e. } \frac{I_{1a} + I_{1b}}{2} < I_{2a}, I_{2b}\right)$$

$$I_{4a} = I_{4b} = \frac{I_{1a} + I_{1b}}{2} \quad (12)$$

(b) The transistors (12a), (12b) are in ON state:

$$\left(\text{i.e. } \frac{I_{1a} + I_{1b}}{2} > I_{2a}, I_{2b}\right)$$

$$I_{4a} = I_{2a} + h_{FEa} \cdot I_{3a} \tag{13}$$

$$I_{4b} = I_{2b} + h_{FEb} \cdot I_{3b} \tag{14}$$

In the case (a), even though it provides $h_{FEa} \neq h_{FEb}$, it gives $I_{4a} = I_{4b}$ to feed equal base currents to the transistors ($I_{3a}$), ($I_{3b}$) and the saturated resistances are equal whereby it does not cause any unbalance of the output voltages of the amplifiers between channels.

In the case (b), if values of the first and second terms of the equations (13), (14) are substantially the same, the effect of $h_{FE}$ is remarkably reduced.

One practical example is as follows. If it provides $$\frac{I_{1a} + I_{1b}}{2} = 41\mu A$$

$$R_{1a} = R_{1b} = 15k\Omega; V_{BE} = 0.6V$$

$$h_{FEa} = 100; h_{FEb} = 110$$

it gives $I_{2a} = I_{2b} = 40 \mu A$ in view of the equations (10), (11).

$$I_{4a} = 40 + 100 \times 1 = 140 \tag{15}$$

$$I_{4b} = 40 + 110 \times 1 = 150 \tag{16}$$

$$\frac{I_{4b}}{I_{4a}} = \frac{150}{140} = 1.071 \tag{17}$$

That is, even though the difference of $h_{FE}$ is only 10%, the ratio of $I_{4b}/I_{4a}$ is different only for 7%. Thus, the difference of the output voltages can be reduced to 7%. Therefore, if the circuit is designed to give substantially equal values for the first and second terms of the equations (13), (14), the adverse effect of difference o $h_{FE}$ can be minimized.

In the semiconductor integrated circuit, the unbalance of the output voltages between channels can be further minimized by reducing distances between the transistors by keeping the second, fourth and fifth transistors in the same section; or by equalizing $V_{BE}$ of the second, fourth and fifth transistors or by equalizing $h_{FE}$ of the sixth and seventh transistors by keeping the sixth and seventh transistors in the same section.

In the embodiment, the number of the collectors of each of the multicollector transistors (8a), (8b) is 2, however, the same operation can be expected by changing the number to even number of 4 . . . 8 or $\frac{1}{2}$.

As described, in accordance with the present invention each of the resistors are respectively connected between the base and the emitter of the transistor for actuating the ALC transistor, and the multicollector transistor is used in the current mirror circuit for feeding current to the base of the transistor for actuation, whereby the unbalance of the output voltages of the amplifiers between channels can be lower than that of the conventional circuit. In the semiconductor integrated circuit, the transistors for actuation and the multicollector transistors are respectively kept in the same section, whereby the unbalance can be further reduced.

We claim:

1. An automatic level control circuit which comprises:
   a pair of amplifiers;
   a pair of rectifying circuits each respectively connected to the outputs of said pair of amplifiers and producing a direct current output;
   a first transistor whcih receives said direct current output from each of said rectifier circuits, through a first resistor to a base thereof;
   a second resistor connected between an emitter of said first transistor and the ground;
   a second transistor whose collector is connected to a collector of said first transistor and whose emitter is connected through a third resistor to a power source;
   a third transistor whose emitter and base are respectively connected to the base and collector of said second transistor, and whose collector is grounded;
   fourth and fifth transistors each having a multicollector sturcture having each base connected to the base of said second transistor and wherein said fourth transistor has one of its collectors connected to one of the collectors of said fifth transistor;
   fourth and fifth resistors connected between emitters of said fourth and fifth transistors and said power source;
   sixth and seventh transistors whose bases are respectively each connected to one of the collectors of said fourth and fifth transistors;
   sixth and seventh resistors which are respectively connected between said power source and each of the collectors of sixth and seventh transistors;
   eighth and ninth resistors which are respectively connected between each base and emitter of said sixth and seventh transistors;
   eighth and ninth transistors whose bases are respectively connected to each of the emitters of said sixth and seventh transistors, and whose emitter are grounded; and
   a pair of input resistors with each of said input resistors connected to each of the collectors of said eighth and ninth transistors to attain automatic leveling operation by utilizing the saturated resistances of said eighth and ninth transistors.

2. The automatic level controlling circuit according to claim 1 wherein said second, fourth and fifth transistors are kept in the same section of a semiconductor integrated circuit.

3. The automatic level controlling circuit according to claim 1 wherein said sixth and seventh circuits are kept in the same section of a semiconductor integrated circuit.

4. The automatic level controlling circuit according to claim 1 wherein the number of collectors of said fourth and fifth transistors are respectively 2n (n is an integer) and n of said collectors are respectively connected to n of collectors of the other transistor.

* * * * *